United States Patent [19]

Komiya et al.

[11] Patent Number: 4,564,768
[45] Date of Patent: Jan. 14, 1986

[54] CONTACTLESS RELAY

[75] Inventors: Hidetsugu Komiya; Michiya Inoue, both of Hino, Japan

[73] Assignee: Fanuc Ltd., Minamitsuru, Japan

[21] Appl. No.: 489,089

[22] Filed: Apr. 27, 1983

[30] Foreign Application Priority Data

Apr. 27, 1982 [JP] Japan ............................ 57-61716[U]

[51] Int. Cl.⁴ ............................................ H03K 17/56
[52] U.S. Cl. .................................. 307/140; 307/240; 307/244
[58] Field of Search ........... 307/125, 127, 130, 132 E, 307/140, 240, 244, 571, 575, 577, 583, 584; 363/18–21, 131–134

[56] References Cited

U.S. PATENT DOCUMENTS

| | | | |
|---|---|---|---|
| 3,378,700 | 4/1968 | Stewart | 307/254 |
| 3,389,327 | 6/1968 | Fine et al. | 307/240 X |
| 3,418,495 | 12/1968 | Bose | 307/239 |
| 3,760,198 | 9/1973 | Mori et al. | 307/268 |
| 3,767,942 | 10/1973 | Schwartz | 307/257 |
| 4,052,623 | 10/1977 | Loberg | 307/246 X |
| 4,150,424 | 4/1979 | Nuechterlein | 363/134 X |
| 4,255,699 | 3/1981 | Calvin | 307/125 X |
| 4,319,144 | 3/1982 | King et al. | 307/127 X |
| 4,423,341 | 12/1983 | Shelly | 307/577 X |

FOREIGN PATENT DOCUMENTS 2132572 1/1972 Fed. Rep. of Germany .
2533107 10/1977 Fed. Rep. of Germany .
2850841 8/1979 Fed. Rep. of Germany .
3028986 3/1982 Fed. Rep. of Germany .
3125242 3/1982 Fed. Rep. of Germany .

OTHER PUBLICATIONS

Electronics, vol. 43, No. 14, Jul. 6, 1970, p. 78, New York, U.S., C. H. Ristad, "Switched Oscillator Controls Four-Wire Resistance Checks".
Electronics Design, No. 7, Apr. 1, 1970, p. 77, Rochelle Park, U.S., C. A. Herbst "Solid-State Isolation Relay has Nonpolarized Terminals".
Solid-State Relay by Evans et al., "Electronic", vol. 51, No. 13, Jun. 22, 1978, p. 108.

Primary Examiner—J. R. Scott
Assistant Examiner—Derek S. Jennings
Attorney, Agent, or Firm—Staas & Halsey

[57] ABSTRACT

A contactless relay wherein the application of an A.C. signal to the primary winding of a transformer is controlled by a command input, and the A.C. signal obtained from the secondary winding of the transformer is rectified into a D.C. signal by a rectifier circuit. The D.C. signal drives a transistor switching element for switching action. The switching element includes a single bipolar transistor, or a pair of bipolar transistors which can be connected in parallel to increase the current-carrying capacity of the relay. The output terminals of the relay can be rendered non-polar by constructing the relay of two bipolar transistors having commonly connected emitters and commonly connected bases.

2 Claims, 3 Drawing Figures

CONTACTLESS RELAY

CROSS REFERENCE TO RELATED APPLICATION

This application is related to copending application U.S. Ser. No. 474,337.

BACKGROUND OF THE INVENTION

This invention relates to a contactless relay which relies upon electronic circuitry to perform the same function as a relay with contacts.

A relay having mechanical contacts, such as a reed relay, is employed widely in the art for transmitting signals between two systems having different signal levels, as when interfacing a numerical control device and machine tool. The relay with contacts applied in this fashion is ideal in that its output terminals are non-polarized, its input and output are isolated DC-wise, and it is small in size. Nevertheless, relays with contacts of a mechanical nature are disadvantageous in that they have a shorter lifetime than contactless relays owing to contact wear, and in that they also exhibit lower operating speed. In response to the need for further development of a relay without contacts, many contactless relays incorporating different kinds of electronic circuitry have been proposed, but none have the aforementioned excellent properties possessed by relays provided with contacts.

SUMMARY OF THE INVENTION

Accordingly, an object of the present invention is to provide a contactless relay of small size and long life or "semipermanent" nature, the input and output whereof can be isolated DC-wise.

Another object of the present invention is to provide a contactless relay of small size and long life or "semipermanent" nature, the input and output whereof can be isolated DC-wise, and having output terminals which are non-polarized, similar to the non-polarized output terminals of a relay with contacts.

Still another object of the present invention is to provide a non-polarized, contactless relay having an extremely high switching speed.

According to the present invention, the foregoing objects are attained by providing a contactless relay having a transformer the primary and secondary windings whereof pass an A.C. signal from an oscillator circuit which produces the A.C. signal, the application of the A.C. signal to the primary winding from the oscillator circuit being controlled by a command input signal. The A.C. signal from the secondary winding is rectified by a rectifier circuit and then smoothed by a smoothing circuit to produce a D.C. signal which drives a bipolar transistorized switching element. In an embodiment of the invention, the switching element comprises a pair of bipolar transistors having commonly connected emitters and commonly connected bases, with a diode being backwardly connected across the emitter and collector of each transistor. A load is connected across the collectors of the transistor pair, the collectors serving as non-polarized output terminals owing to the particular connection of the transistors. In another aspect of the invention, the switching element consists of a single bipolar transistor the emitter and collector whereof serve as output terminals connected to a load. Plural bipolar transistors can be connected in parallel.

Other features and advantages of the present invention will be apparent from the following description taken in conjunction with the accompanying drawings, in which like reference characters designate the same or similar parts throughout the figures thereof.

DESCRIPTION OF THE PREFERRED EMBODIMENT

Figure 1:
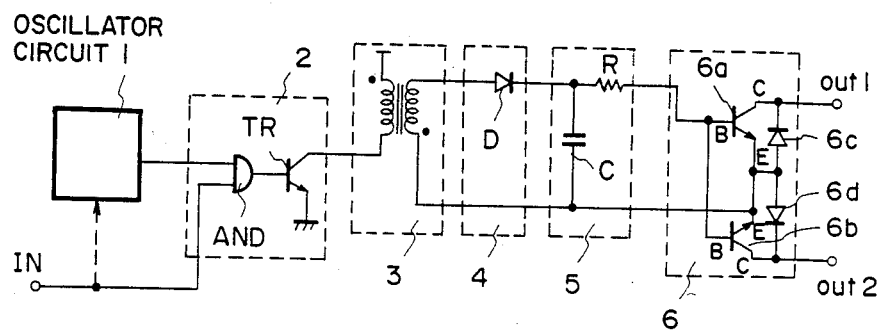
FIG. 1 is a circuit diagram illustrating an embodiment of a contactless relay according to the present invention.

Reference will now be had to FIG. 1 to describe an embodiment of a contactless relay in accordance with the present invention. The relay comprises an oscillator circuit 1, specifically a pulse oscillator circuit such as an astable multivibrator, and a transformer drive circuit 2 having an AND gate AND and a transistor TR. The AND gate AND, which receives the output of the oscillator circuit 1 at one input terminal thereof, is gated open when a command input terminal IN connected to the other input terminal thereof goes high (logical "1"), whereby the AND gate delivers the oscillator circuit output to the base of the transistor TR. The relay further comprises a transformer 3 having its primary winding connected to the collector of the transistor TR in the transformer drive circuit 2. Thus the transformer 3 is driven by the transistor TR turned on and off by the output of the oscillator circuit 1. The secondary winding of the transformer T is connected to a rectifying circuit 4 having a diode D for rectifying the A.C. power developed by the secondary winding of the transformer. A smoothing circuit 5, comprising a capacitor C and a resistor R connected in series, is operable to smooth the output of the rectifying circuit 4 to provide a D.C. signal. The relay of the present invention also includes a switching element 6. According to a preferred embodiment, the switching element 6 comprises a pair of rapid switching, bipolar transistors 6a, 6b. The emitters of the transistors 6a, 6b are tied together and connected to one output terminal of the smoothing circuit 5, and the bases thereof are similarly tied together and connected to the other output terminal of the smoothing circuit 5. The collectors of the respective transistors 6a, 6b constitute output terminals $out_1$, $out_2$ for connection to a load. The switching element 6 also includes diodes 6c, 6d, connected backwardly across the collector and emitter of the transistors 6a, 6b, respectively, in order to prevent the application of a reverse bias voltage.

In the operation of the relay shown in FIG. 1, a high-level signal is applied to the command input terminal IN from externally located control means (not shown) to turn on, i.e., close, the relay. The high-level signal opens the AND gate AND of the drive circuit 2, applying the oscillatory output of the oscillator circuit 1 to the base of transistor TR. The latter is switched on and off by the oscillatory signal at its base and drives the primary winding of the transformer 3 connected to its collector, whereby a voltage is induced in the secondary winding of the transformer. A.C. power thus is obtained from the secondary winding and is subsequently rectified by the rectifying circuit 4 and smoothed by the smoothing circuit 5, providing a direct current. The D.C. output of the smoothing circuit 5 is applied to the bases of the transistors 6a, 6b, thereby driving the transistors 6a, 6b into conduction to form a current path between the output terminals out$_1$, out$_2$.

With the above-described connections among the transistors 6a, 6b and diodes 6c, 6d in the switching element 6, the relay will operate regardless of the polarity of the load connected across the output terminals out$_1$, out$_2$. In other words, in a case where the output terminals out$_1$, out$_2$ are of positive and negative polarity, respectively, current will flow through transistor 6a and diode 6d. If the polarities are reversed, then current will flow through transistor 6b and diode 6c. Thus, the relay is of non-polar type as it will operate irrespective of the load polarity.

Figure 2:
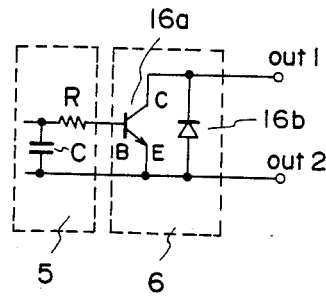
FIG. 2 is a circuit diagram illustrating another embodiment of a switching element shown in FIG. 1.

When a relay of non-polarized operation is not required, the switching element 6 need be provided with only one transistor 16a, as shown in FIG. 2. This will enable the relay to be used with a load where the polarity of output terminal out$_1$ will be positive and that of output terminal out$_2$ negative. In this case also a diode, indicated at 16b, will be connected across the collector and emitter of the transistor to prevent reverse bias.

Figure 3:
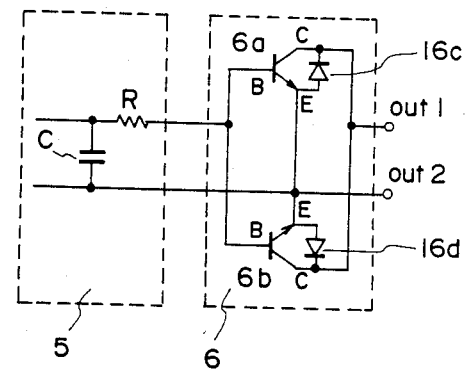
FIG. 3 is still another embodiment of the switching element shown in FIG. 1.

FIG. 3 illustrates another embodiment of the present invention useful for increasing the current-carrying capacity of the switching element. In this arrangement, the collectors of the bipolar transistors 6a, 6b are tied together, one terminal of the load is connected to the common collectors, and the other terminal of the load is connected to the common emitters. Thus the arrangement is such that the commonly connected collectors serve as the output terminal out$_1$ and the commonly connected emitters serve as the output terminal out$_2$.

The reasons for employing the rapidly operable bipolar transistors in the switching element 6 of the foregoing embodiment are as follows. In comparison with a switching element using MOSFETs or the like, the aforementioned bipolar transistors exhibit quicker on-/off action, have a larger current-carrying capacity and are less costly. A switching element employing these bipolar transistors consequently is more effective for large-current loads that require good response.

An arrangement can be adopted wherein the oscillator circuit 1 is rendered operational for an interval of time during which the command input IN is high. In other words, the command input IN when at logical "1" would serve as an enable signal for the oscillator circuit 1, allowing the AND gate to be deleted from the relay circuitry.

In accordance with the present invention as described and illustrated hereinabove, a D.C. command input for controlling the on/off operation of the contactless relay is temporarily converted into an A.C. signal. The A.C. signal, upon passage through the transformer 3, is converted into a D.C. signal by the rectifying and smoothing circuits 4, 5 to drive a bipolar transistor(s) serving as a switch. With the contactless relay of the invention, therefore, the input and output of the relay are isolated D.C.-wise by the transformer 3. Moreover, the relay is small in size and has the advantage of a relay with contacts in that its output terminals are non-polarized. Since the switching element uses bipolar transistors, the relay, besides being contactless, is endowed with a comparatively large current carrying capacity and quick response. In addition, the relay can be constructed at low cost. Owing to the contactless nature of the relay, semi-permanent operation is assured. This extends the useful life of the device employing the relay and facilitates maintenance.

As many apparently widely different embodiments of the present invention can be made without departing from the spirit and scope thereof, it is to be understood that the invention is not limited to the specific embodiments thereof except as defined in the appended claims.

What we claim is:

1. A contactless relay comprising:

oscillating means for generating an A.C. signal;

a transformer having primary and secondary windings for delivering the A.C. signal from said oscillating means, the A.C. signal being applied to the primary windings and delivered from the secondary windings;

AND gate means having a first input operatively connected to receive said A.C. signal, a second input operatively connected to receive input and an output, for providing said A.C. signal in accordance with said first and second inputs;

a transistor having a base operatively connected to said output of said AND gate means, a collector operatively connected to said primary of said transformer, and an emitter for applying said A.C. signal to the primary windings of said transformer;

a diode having an anode operatively connected to a first end of said secondary of said transformer and a cathode, for rectifying the A.C. signal obtained from the secondary windings of said transformer, said diode producing a rectified output;

a smoothing circuit including a capacitor operatively connected to said cathode and to a second end of said secondary, and a resistor having a first end operatively connected to said cathode and a second end, for smoothing the rectified output produced by said diode and for delivering a D.C. output signal; and bipolar transistor switching means driven by the D.C. signal from said smoothing circuit and including -- a pair of bipolar transistors having interconnected emitters, interconnected bases operatively connected to said second end of said resistor and respective collectors, a pair of diodes respectively and backwardly connected across a corresponding emitter and collector of one of said pair of bipolar transistors.

2. A contactless relay according to claim 1, wherein said collectors are interconnected to form an output and said interconnected emitters form another output.

* * * * *

UNITED STATES PATENT AND TRADEMARK OFFICE
CERTIFICATE OF CORRECTION

PATENT NO. : 4,564,768

DATED : January 14, 1986

INVENTOR(S) : KOMIYA ET AL.

It is certified that error appears in the above-identified patent and that said Letters Patent is hereby corrected as shown below:

Column 4, line 28, after "receive" insert --a command--.

Signed and Sealed this

First Day of April 1986

[SEAL]

Attest:

Attesting Officer

DONALD J. QUIGG

Commissioner of Patents and Trademarks